United States Patent
Kawamura et al.

(10) Patent No.: US 6,855,886 B2
(45) Date of Patent: Feb. 15, 2005

(54) PHOTODETECTION SENSOR (75) Inventors: Masahiro Kawamura, Kitakatsuragi-gun (JP); Hirofumi Shindo, Naga-gun (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/766,909

(22) Filed: Jan. 30, 2004

(65) Prior Publication Data
US 2004/0182591 A1 Sep. 23, 2004

(30) Foreign Application Priority Data

Feb. 5, 2003 (JP) ........................................ 2003-027968

(51) Int. Cl.[7] .............................................. H01L 23/28
(52) U.S. Cl. ....................... 174/52.2; 257/680; 174/52.4
(58) Field of Search ............................... 174/52.2, 52.4; 257/680, 681, 676

(56) References Cited

U.S. PATENT DOCUMENTS

| | | | | |
|---|---|---|---|---|
| 3,560,813 A | * | 2/1971 | Phy | 257/680 |
| 4,309,717 A | * | 1/1982 | Cardinal | 257/680 |
| 4,439,006 A | * | 3/1984 | Stevenson | 385/88 |
| 4,706,106 A | * | 11/1987 | Shiba et al. | 257/682 |
| 5,089,861 A | * | 2/1992 | Tanaka et al. | 372/36 |
| 5,550,675 A | * | 8/1996 | Komatsu | 359/514 |
| 5,567,972 A | * | 10/1996 | Abe | 257/433 |
| 6,489,677 B2 | * | 12/2002 | Okada et al. | 257/712 |
| 6,627,814 B1 | * | 9/2003 | Stark | 174/52.3 |

FOREIGN PATENT DOCUMENTS

JP  9084162  3/1997

* cited by examiner

*Primary Examiner*—Hung V. Ngo
(74) *Attorney, Agent, or Firm*—Nixon & Vanderhye, P.C.

(57) ABSTRACT

A photodetection sensor allows electrical connection between conductive resin and grounding terminal to be reliably fulfilled, and is capable of obtaining a larger electromagnetic shield effect so that the photodetection sensor can be used even under electromagnetic noise-prone environments. Also, a photodetection sensor no longer necessitates a separate component metal mesh so that the photodetection sensor is low in price, simple to manufacture and high in productivity. Through holes are formed in electrical connecting portions connected to a grounding terminal via a header. The electrical connecting portions are protruded from a surface of a light-pervious resin and encapsulated in an electrically conductive resin. This conductive resin is filled into the through holes and engaged with inner surfaces of the through holes like an anchor, thus unlikely to peel off. Therefore, the grounding of the electrically conductive resin is ensured, allowing a stable electromagnetic shield effect to be obtained.

11 Claims, 8 Drawing Sheets

PHOTODETECTION SENSOR

This nonprovisional application claims priority under 35 U.S.C. §119(a) on Patent Application Ser. No. 2003-027968 filed in Japan on Feb. 5, 2003, the entire contents of which are hereby incorporated by reference.

BACKGROUND OF THE INVENTION

The present invention relates to a photodetection sensor to be used in various types of electronic equipment, such as TVs (Television Receivers) or VTRs (Video Tape Recorders), for use of reception of remote-control signal light.

Conventionally, there has been available a photodetection sensor for remote control use, for example, as described in Japanese Unexamined Patent Application No. H09-84162. This photodetection sensor has a photodetection chip, a control-use IC chip, a chip resistor and a chip capacitor, all of which are mounted on a lead frame and encapsulated in an insulative light-pervious resin having a lens portion. Further, for shielding from electromagnetic noise, the top surface of the light-pervious resin is covered with an electrically conductive resin, and a strip-shaped protruding portion of a grounding terminal of the lead frame is covered with this conductive resin, by which the conductive resin and the grounding terminal are electrically connected to each other.

In this conventional photodetection sensor, the lens portion of the light-pervious resin at the frontage of the photodetection chip is covered with a separate component member, metal mesh, not with the conductive resin so that infrared remote-control signal light can be received by the photodetection chip. This metal mesh is integrally fixed to the lens portion by injection molding of the conductive resin. More specifically, with the separate component metal mesh put on the lens portion of the light-pervious resin, these members are set to a metal mold and the conductive resin is injection-molded therein, by which the metal mesh is integrally fixed to the lens portion.

However, in this conventional photodetection sensor, the electrical connection between the grounding terminal and the conductive resin is fulfilled by covering the strip-shaped protruding portion of the grounding terminal protruded from the light-pervious resin with electrically conductive resin. This causes a problem that the conductive resin is liable to peel off from the grounding terminal because of thermal stress due to abrupt temperature changes or the like. This peeling, once occurred, would cause the electrical connection between the conductive resin and the grounding terminal to be insufficient, resulting in a decreased electromagnetic shield effect. Thus, the conventional photodetection sensor has an issue that it cannot be used under environments involving much electromagnetic noise.

Also, in the above conventional photodetection sensor, with a separate component metal mesh put on the lens portion of the light-pervious resin, these members are set to a metal mold, and the conductive resin is injection-molded, by which the metal mesh is integrally fixed to the lens portion. Therefore, there arises a need for a metal mesh, which is a separate component, involving a cost increase as well as time and labor for setting the metal mesh to the lens portion, with the result of a further issue of worse productivity.

SUMMARY OF THE INVENTION

Accordingly, an object of the present invention is to provide a photodetection sensor which allows electrical connection between the conductive resin and the grounding terminal to be reliably fulfilled, and which is capable of obtaining a larger electromagnetic shield effect so that the photodetection sensor can be used even under electromagnetic noise-prone environments.

Further, another object of the present invention is to provide a photodetection sensor which no longer necessitates a separate component metal mesh so that the photodetection sensor is low in price, simple to manufacture and high in productivity.

In order to achieve the above object, according to the present invention, there is provided a photodetection sensor comprising:

a lead frame having a grounding terminal, a header connected to this grounding terminal, and signal input/output terminals;

a photodetection chip mounted on a surface of the header of the lead frame;

an insulative light-pervious resin encapsulating the photodetection chip and part of the lead frame, tip end portions of the signal input/output terminals of the lead frame being protruded from the light-pervious resin; and an electrically conductive resin encapsulating a surface of the light-pervious resin except at least a terminal-side exposed portion of the light-pervious resin in vicinity of the tip end portions of the signal input/output terminals, and wherein the lead frame includes:

an electrical connecting portion directly or indirectly connected to the grounding terminal of the lead frame and having a through hole, and wherein the electrical connecting portion is protruded from the light-pervious resin and encapsulated in the electrically conductive resin.

According to this constitution, since the electrical connecting portion directly or indirectly connected to the grounding terminal of the lead frame and having the through hole is encapsulated in the electrically conductive resin, the conductive resin runs into the through hole so that the conductive resin becomes less liable to peel off from the electrical connecting portion. Therefore, the grounding of the conductive resin can be fulfilled reliably at all times, so that the electromagnetic shielding can be fulfilled reliably at all times. Consequently, this photodetection sensor can be used stably even under electromagnetic noise-prone environments.

It is noted that the shape of the through hole may be any one such as round, elliptical and rectangular shapes.

In one embodiment, a diameter of the through hole is not less than a plate thickness of the lead frame.

In this embodiment, since the diameter of the through hole is not less than the plate thickness of the lead frame, that is, not less than the plate thickness of the electrical connecting portion, the electrically conductive resin easily runs into the through hole during the molding of the conductive resin, thus being filled enough. Accordingly, the conductive resin and the electrical connecting portion become less likely to peel off from each other, and are electrically connected to each other reliably. It has been found that if the diameter of the through hole is less than the plate thickness of the lead frame, the conductive resin is less easily filled into the through hole and therefore more likely to peel off from the electrical connecting portion, making it impossible in some cases to securely obtain the electrical connection between the conductive resin and the electrical connecting portion. Further, it has been found that for the diameter of the through hole, the plate thickness of the lead frame (electrical connecting portion) has a critical significance.

It is noted that the diameter of the through hole herein refers to the diameter of a hole for round holes, and the diameter of an inscribed circle of the hole for elliptical holes and rectangular or other polygonal holes.

Preferably, for a larger diameter of the through hole, the tip end portion of the electrical connecting portion is made larger in width so as to be larger in area than its base portion, and a larger through hole is opened at this larger-area tip end portion.

According to one aspect of the present invention, there is provided a photodetection sensor comprising:

a lead frame having a grounding terminal, a header connected to this grounding terminal, and signal input/output terminals;

a photodetection chip mounted on a surface of the header of the lead frame;

an insulative light-pervious resin encapsulating the photodetection chip and part of the lead frame, tip end portions of the signal input/output terminals of the lead frame being protruded from the light-pervious resin; and an electrically conductive resin encapsulating a surface of the light-pervious resin except at least a terminal-side exposed portion of the light-pervious resin in vicinity of the tip end portions of the signal input/output terminals, and wherein the terminal-side exposed portion of the light-pervious resin has a length of at least 0.2 mm in a direction along which the signal input/output terminals extend.

In this constitution, since the terminal-side exposed portion of the light-pervious resin has a length of at least 0.2 mm in a direction along which the signal input/output terminals extend, the conductive resin can reliably be prevented from leaking out to vicinities of the signal input/output terminals during the molding process by clamping this terminal-side exposed portion with the metal mold. Accordingly, short-circuits between the conductive resin and the signal input/output terminals can reliably be prevented. If the terminal-side exposed portion has a length of less than 0.2 mm in the direction along which the signal input/output terminals extend, then the short-circuits between the conductive resin and the signal input/output terminals cannot be prevented reliably due to the effects of setting errors of the light-pervious resin package against the metal mold and the like.

Also, according to one aspect of the invention, there is provided a photodetection sensor comprising:

a lead frame having a grounding terminal, a header connected to this grounding terminal, and signal input/output terminals;

a photodetection chip mounted on a surface of the header of the lead frame;

an insulative light-pervious resin encapsulating the photodetection chip and part of the lead frame, tip end portions of the signal input/output terminals of the lead frame being protruded from the light-pervious resin; and an electrically conductive resin encapsulating a surface of the light-pervious resin except at least a terminal-side exposed portion of the light-pervious resin in vicinity of the tip end portions of the signal input/output terminals, and wherein the lead frame includes:

an electrical connecting portion directly or indirectly connected to the grounding terminal, the electrical connecting portion is protruded from the light-pervious resin and encapsulated in the electrically conductive resin, and wherein the electrically conductive resin has a resistivity of not more than 100 Ω·cm.

In this constitution, since the resistivity of the conductive resin is not more than 100 Ω·cm, the conductive resin and the electrical connecting portion, and therefore the conductive resin and the grounding terminal are electrically connected to each other stably even against thermal stress due to soldering mounting and the like. Accordingly, this photodetection sensor, which is given a stable electromagnetic shield, can be used even under electromagnetic noise-prone environments. If the resistivity of the conductive resin is beyond 100 Ω·cm, the reliability of the electrical connection between the conductive resin and the grounding terminal abruptly decreases due to the thermal stress.

Further, according to one aspect of the invention, there is provided a photodetection sensor comprising:

a lead frame having a grounding terminal, a header connected to this grounding terminal, and signal input/output terminals;

a photodetection chip mounted on a surface of the header of the lead frame;

an insulative light-pervious resin encapsulating the photodetection chip and part of the lead frame, tip end portions of the signal input/output terminals of the lead frame being protruded from the light-pervious resin; and an electrically conductive resin encapsulating a surface of the light-pervious resin except at least a terminal-side exposed portion of the light-pervious resin in vicinity of the tip end portions of the signal input/output terminals, and wherein the light-pervious resin has a lens portion confronting the photodetection chip, and wherein a rear-face-side exposed portion that is not covered with the electrically conductive resin but exposed is present at a portion of the light-pervious resin that covers a rear face of the header on one side opposite to a surface side on which the photodetection chip is mounted, and this rear-face-side exposed portion confronts the rear face of the header and a projection plan of the rear-face-side exposed portion onto the rear face of the header falls inside a profile of the rear face of the header.

In this constitution, a rear-face-side exposed portion which is not covered with the conductive resin but exposed is present at a portion of the light-pervious resin that covers the rear face of the header on one side opposite to the surface side on which the photodetection chip is mounted, and the rear-face-side exposed portion confronts the rear face of the header and a projection plan of the rear-face-side exposed portion onto the rear face of the header falls inside the profile of the rear face of the header. Therefore, the photodetection chip or the like mounted on the surface of the header is electromagnetically shielded against electromagnetic noise coming from the rear-face-side by the header itself adjoining and electrically connected to the grounding terminal. Consequently, this photodetection sensor can be used even under electromagnetic noise-prone environments.

Further, a necessary spot of the lens can be put into close contact with the inner surface of the metal mold by pressing the rear-face-side exposed portion of the light-pervious resin by means of a fixed pin during the molding of the conductive resin. Therefore, a light-pervious resin package can be set into the metal mold with high precision so that the conductive resin can be made generally uniform in thickness as desired with precision, and moreover the conductive resin can be prevented from leaking onto the surface of the lens portion. Besides, although the rear-face-side exposed portion with which the fixed pin makes contact is not covered with the conductive resin, yet it does not matter because the header serves for electromagnetic shielding as described before.

According to the present invention, there is provided a method for manufacturing a photodetection sensor, comprising the steps of:

mounting a photodetection chip onto a surface of a header of a lead frame connected to a grounding terminal of the lead frame, and encapsulating the photodetection chip and part of the lead frame in an insulative light-pervious resin having a lens portion confronting the photodetection chip, by which a light-pervious resin package is formed; and setting the light-pervious resin package into a metal mold for use with electrically conductive resin, and pressing in one direction, by means of a fixed pin, a surface of the light-pervious resin of the light-pervious resin package confronting a rear face of the header and corresponding to inside of a profile of the rear face of the header, by which at least part of the lens portion is put into close contact with an inner surface of the metal mold, and injecting an electrically conductive resin into the metal mold, by which the light-pervious resin package except at least part of the lens portion is encapsulated in the electrically conductive resin.

In this constitution, when the light-pervious resin package is set into the metal mold for use with electrically conductive resin for encapsulating in an electrically conductive resin, the surface of the light-pervious resin of the light-pervious resin package confronting the rear face of the header and corresponding to the inside of the profile of the rear face of the header is pressed in one direction by the fixed pin, so that at least part of the lens portion is put into close contact with the inner surface of the metal mold. Therefore, the light-pervious resin package can be set into the metal mold with high precision so that the conductive resin can be made generally uniform in thickness as desired with high precision, and moreover the conductive resin can be prevented from leaking onto the surface of the lens portion. Furthermore, the spot of the light-pervious resin package to be pressed by the fixed pin, which confronts the rear face of the header and which corresponds to the inside of the profile of the rear face of the header, is not covered with the conductive resin. However, since the spot confronts the rear face of the header and corresponds to the inside of the profile of the rear face of the header, the header itself can implement the electromagnetic shielding for the photodetection chip and the like. Therefore, according to the photodetection sensor manufacturing method of the invention, a photodetection sensor capable of fulfilling effective electromagnetic shielding against electromagnetic noise can be manufactured with simplicity and low price.

Furthermore, in one aspect of the invention, there is provided a photodetection sensor comprising:

a lead frame having a grounding terminal, a header connected to this grounding terminal, and signal input/output terminals;

a photodetection chip mounted on a surface of the header of the lead frame;

an insulative light-pervious resin encapsulating the photodetection chip and part of the lead frame, tip end portions of the signal input/output terminals of the lead frame being protruded from the light-pervious resin; and an electrically conductive resin encapsulating a surface of the light-pervious resin except at least a terminal-side exposed portion of the light-pervious resin in vicinity of the tip end portions of the signal input/output terminals, and wherein the light-pervious resin has a lens portion confronting the photodetection chip, and wherein the photodetection sensor further includes a meshed electrically conductive resin that covers part of a surface of the lens portion.

In this constitution, since part of the surface of the lens portion is covered with the meshed electrically conductive resin, intrusion of electromagnetic noise from the lens portion can be prevented. Yet, infrared remote-control signal light can be detected. Therefore, considerable deteriorations of reception distance characteristics can be prevented even under environments in which large electromagnetic noise is generated.

Further, since this photodetection sensor does not use any separate component parts like a metal mesh, there is no need for the assembly step for separate component parts. Moreover, since the meshed conductive resin can be integrally molded by injection molding, the photodetection sensor can be manufactured with simplicity and low price and at high productivity.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Hereinbelow, the present invention is described in detail by way of embodiments thereof illustrated in the accompanying drawings.

The First Embodiment

Figure 1A:
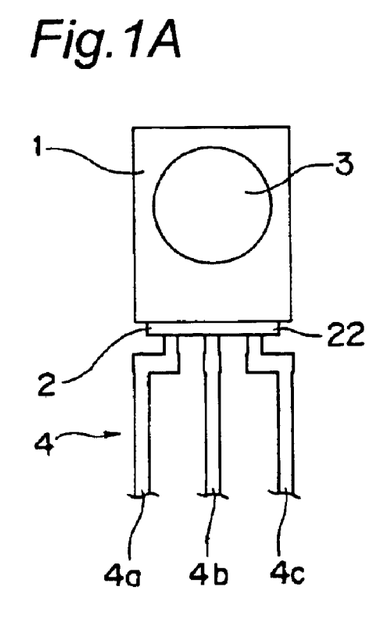
FIG. 1A is a plan view of a photodetection sensor according to a first embodiment of the present invention.
Figure 1B:
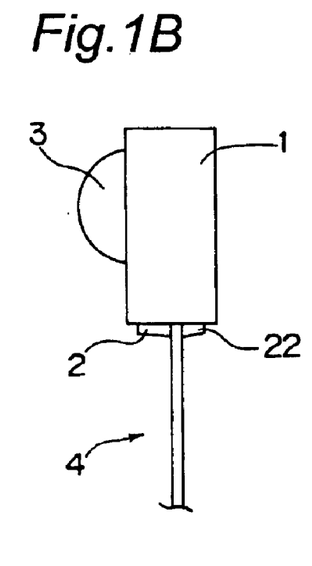
FIG. 1B is a side view of the photodetection sensor.
Figure 2A:
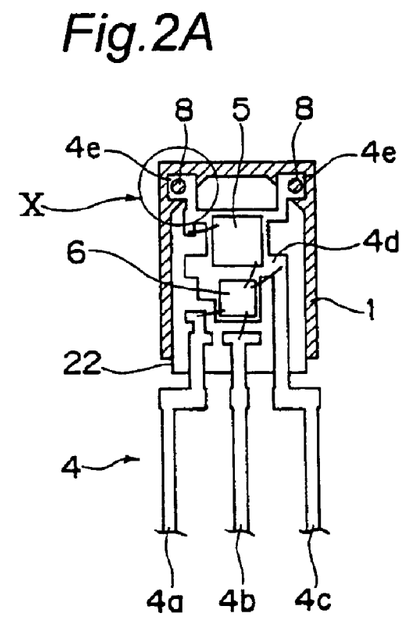
FIG. 2A is a horizontal sectional view of the photodetection sensor.

FIG. 1A is a plan view of a photodetection sensor according to a first embodiment of the present invention, and FIG. 1B is a side view of the photodetection sensor. FIG. 2A is a horizontal sectional view of the photodetection sensor, and FIG. 2B is a vertical sectional view of the photodetection sensor.

As shown in FIGS. 1A and 1B, this photodetection sensor is so constructed that part of a lead frame 4 is encapsulated in an insulative light-pervious resin 2 having a lens portion 3, and further part of this light-pervious resin 2 is encapsulated in an electrically conductive resin 1.

Figure 2B:
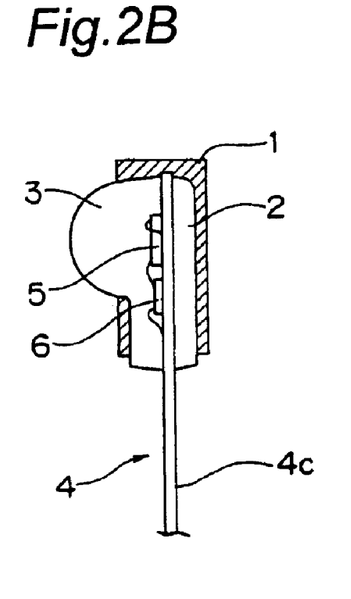
FIG. 2B is a vertical sectional view of the photodetection sensor.

As shown in FIGS. 2A and 2B, the lead frame 4 is composed of signal input/output terminals 4a, 4b, a grounding terminal 4c, a header 4d connected to this grounding terminal 4c, and electrical connecting portions 4e, 4e extending from the header 4d toward one side reverse to the side toward which the grounding terminal 4c extends. On the surface of this header 4d, a photodetection chip 5 and a control-use IC (integrated circuit) chip 6 are mounted. The photodetection chip 5 and the control-use IC chip 6 are connected to the electrical connecting portions 4e and the grounding terminal 4c by gold wires or the like so as to be grounded, and moreover the control-use IC chip 6 is connected to the signal input/output terminals 4a, 4b by gold wires or the like. Furthermore, the photodetection chip 5 and the control-use IC chip 6 are connected to each other by gold wires or the like.

Meanwhile, part of the lead frame 4, the photodetection chip 5 and the control-use IC chip 6 are encapsulated in the light-pervious resin 2 having the lens portion 3. The lens portion 3 is opposed to the frontage of the photodetection chip 5 so as to converge the light onto the photodetection chip 5.

Each of the electrical connecting portions 4e, 4e of the lead frame 4 has its tip end side protruding from the surface of the light-pervious resin 2. The electrical connecting portions 4e have respectively a header 4d side base portion and a tip end side portion wherein the tip end side portion has a width wider than that of the header 4d side base portion, where a through hole 8, which is a round hole as an example, is provided in this tip end side portion of larger width. The size, i.e. diameter, of this through hole 8 is set larger than the plate thickness of the lead frame 4. It is noted that the through hole 8 may be provided in any other shape other than the round hole, such as elliptical or polygonal or other holes. In the case of an elliptical or polygonal or other hole, its diameter is herein defined as the diameter of its inscribed circle.

Further, for electromagnetic shielding, the surface of the light-pervious resin 2 is covered with the conductive resin 1. However, in order that infrared remote-control signal light can be received by the photodetection chip 5, a circular opening corresponding to the lens portion 3 is provided in the conductive resin 1 so as to prevent the lens portion 3 at the frontage of the photodetection chip 5 from being encapsulated in the conductive resin 1.

Figure 3A:
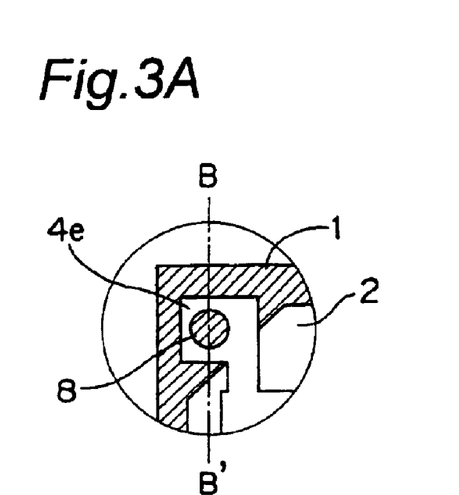
FIG. 3A is an enlarged view of a portion indicated by X in FIG. 2A.
Figure 3B:
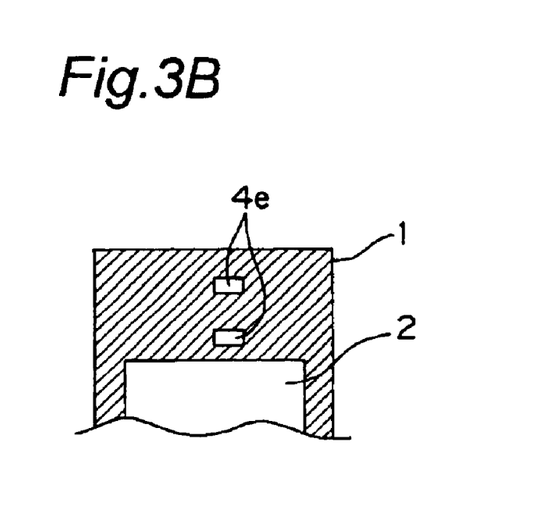
FIG. 3B is a sectional view taken along the line B-B' of FIG. 3A.

For the grounding of the conductive resin 1, the electrical connecting portions 4e, 4e connecting to the grounding terminal 4c via the header 4d are encapsulated in the conductive resin 1. Thus, by the encapsulating of the electrical connecting portions 4e protruding from the surface of the light-pervious resin 2 in the conductive resin 1, as shown in FIGS. 3A and 3B, the conductive resin 1 is let in and filled into the through hole 8 provided at the tip end side larger width portion of the electrical connecting portion 4e, so that the conductive resin 1 having entered into the through hole 8 is engaged with the inner surface of the through hole 8 of the electrical connecting portion 4e like an anchor, with the result that the conductive resin 1 is less liable to peeling from the electrical connecting portion 4e. Therefore, the grounding of the conductive resin 1 can be achieved stably and reliably, so that the electromagnetic shield effect can be obtained reliably at all times. Consequently, this photodetection sensor can be used even under electromagnetic noise-prone environments.

If the size (diameter) of the through hole 8 is too small, the conductive resin 1 could not sufficiently be injected into the through hole 8 during the molding of the conductive resin 1, incurring an unfilled state and resulting in an insufficient electrical connection. Therefore, by setting the diameter of the through hole 8 to not less than the plate thickness of the lead frame 4, in other words from a different viewpoint, by making the through hole 8 having an opening portion whose diameter is larger than the depth of the through hole 8 (plate thickness of the lead frame 4), it becomes possible to sufficiently fill the conductive resin 1 into the through hole 8 so that the reliability of the grounding is remarkably improved. Consequently, the photodetection sensor of this first embodiment is capable of sufficient electromagnetic shielding and can be used stably even under electromagnetic noise-prone environments. Further, in this first embodiment, since the through holes 8, 8 are provided at the tip-end-side larger width portions of the electrical connecting portions 4e, 4e, respectively, the through holes 8, 8 can be made sufficiently large in diameter.

Figure 4A:
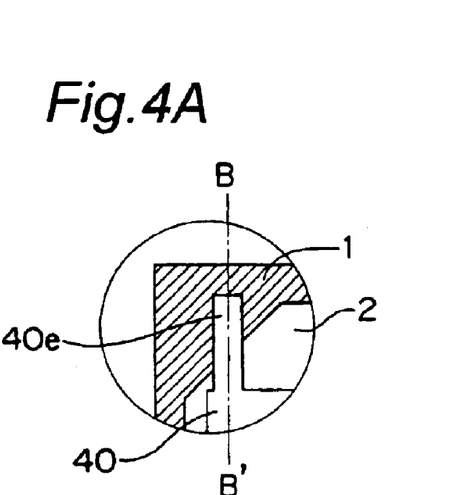
FIG. 4A is a sectional view of a main part of a comparative example.
Figure 4B:
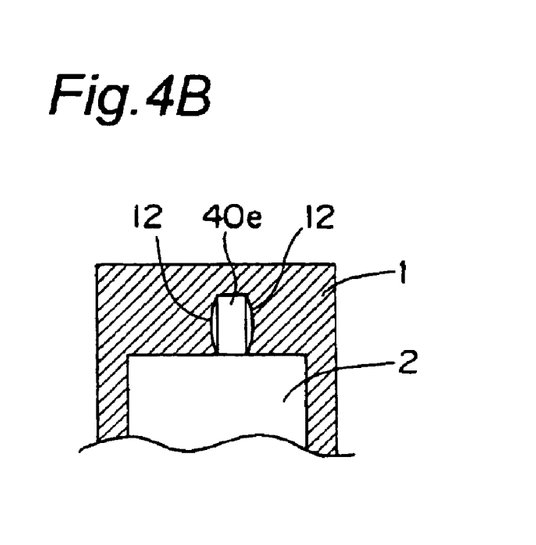
FIG. 4B is a sectional view taken along the line B-B' of FIG. 4A.

FIG. 4A is a sectional view of a main part of a comparative example, and FIG. 4B is a sectional view taken along the line B-B' of FIG. 4A. As can be understood from FIGS. 4A and 4B, when a rectangular plate-shaped electrical connecting portion 40e of a lead frame 40 protruding from the surface of the insulative light-pervious resin 2 is encapsulated in the conductive resin 1, the conductive resin 1 would peel off from the rectangular plate-shaped electrical connecting portion 40e because of thermal stress due to abrupt temperature changes of working environments or the like, where a void 12 would be generated therebetween. As a result, the electrical connection between the conductive resin 1 and the rectangular plate-shaped electrical connecting portion 40e would be unstable, making it impossible to fulfill sufficient electromagnetic shield. Consequently, the photodetection sensor of the comparative example cannot be used under electromagnetic noise-prone environments.

Figure 5:
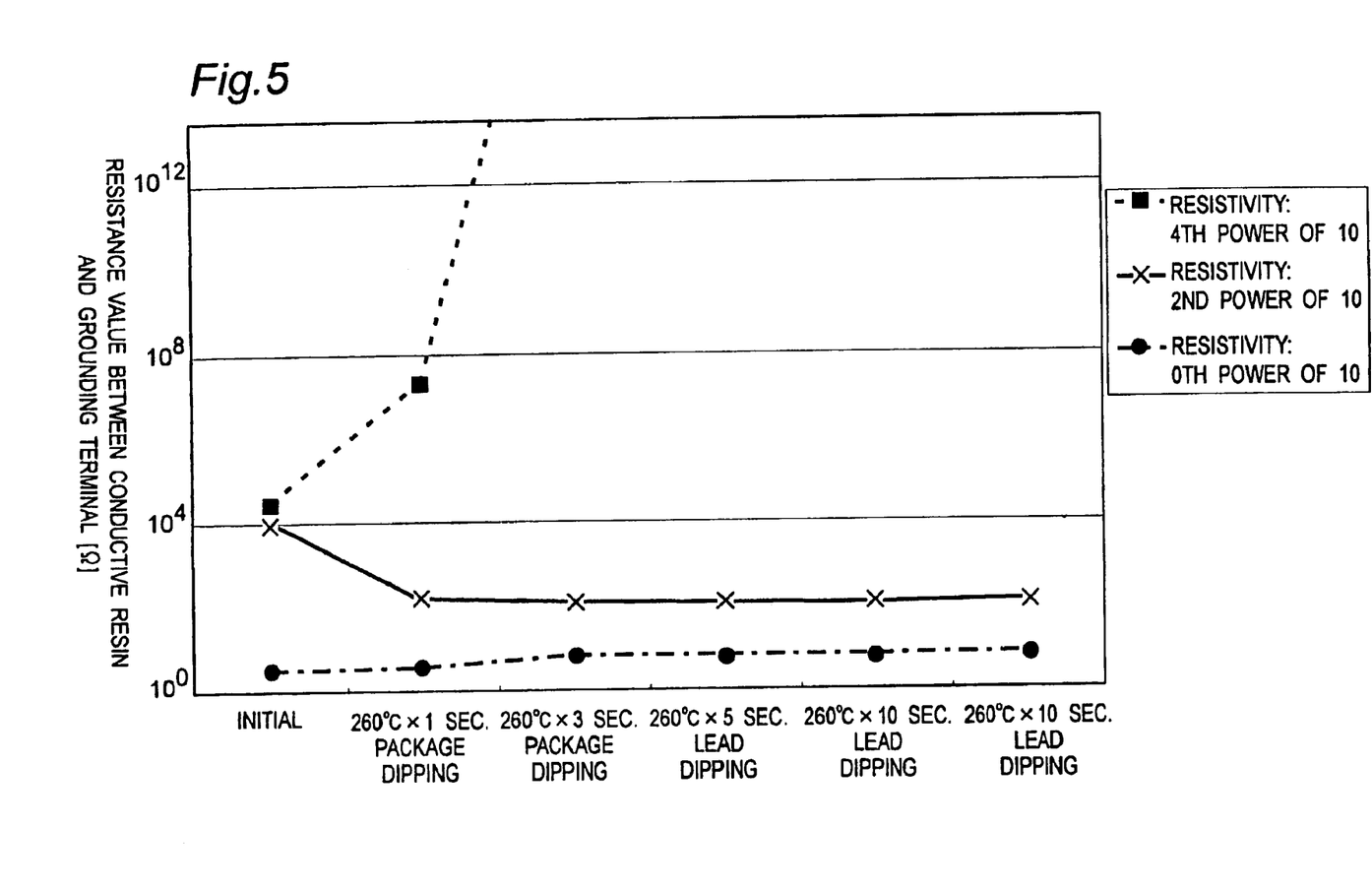
FIG. 5 is a graph showing results of a reliability test of solder heat resistance performed on a photodetection sensor of the construction shown in FIGS. 1 to 3 manufactured by using electrically conductive resins of various resistivities.

FIG. 5 is a graph showing results of a reliability test of solder heat resistance performed on a photodetection sensor of the construction shown in FIGS. 1A, 1B to 3A, 3B manufactured by using electrically conductive resins of various resistivities, in which test it was examined whether or not the conductive resin 1 was stably grounded, i.e., whether or not the conductive resin 1 and the grounding terminal 4c were stably electrically connected to each other.

Figure 6A:
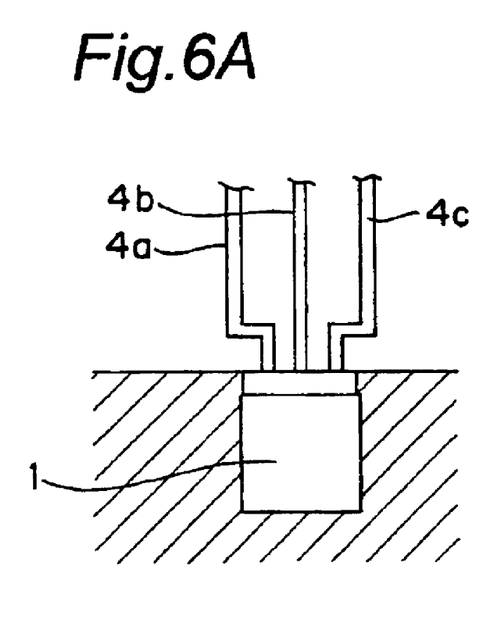
FIGS. 6A and 6B are views showing the method of the reliability test.
Figure 6B:
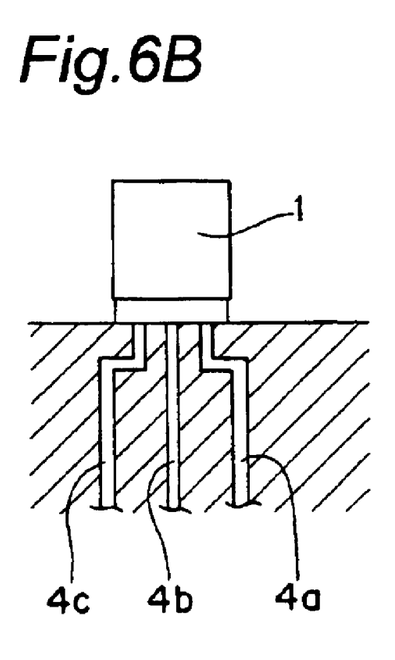

As this reliability test, a dipping test in which part of the photodetection sensor is dipped in a solder dip bath was performed. In FIG. 5, the vertical axis represents the resistance value $\Omega$ between the grounding terminal 4c and the conductive resin 1 present on one side opposite to the lens portion 3 side, while the horizontal axis represents, by a description of "260° C.×1 sec. package dipping" as an example, that a measurement was performed after a 1 sec. dipping of a package (conductive resin 1) in a 260° C. molten solder as shown in FIG. 6A, and, by a description of "260° C.×10 sec. lead dipping" as another example, that a measurement was performed after a 10 sec. dipping of leads (signal input/output terminals 4a, 4b and grounding terminal 4c) in a 260° C. molten solder as shown in FIG. 6B. The test of FIG. 6A is a test that the package (conductive resin 1) is heated from its surface directly with molten solder, and the test of FIG. 6B is a test that the leads (signal input/output terminals 4a, 4b and grounding terminal 4c) are heated with molten solder with the aim of heating from the inside of the package so that heat is transferred along the leads to heat the leads, the photodetection chip 5, the control-use IC chip 6 and the like inside the package. Also, in FIG. 5, ● shows a case where the resistivity $\Omega$·cm of the conductive resin 1 is the 0th power of 10, x shows a case where the resistivity Ω·m of the conductive resin 1 is the 2nd power of 10, and ■ shows a case where the resistivity Ω·cm of the conductive resin 1 is the 4th power of 10.

As can be seen from FIG. 5, in the case where the resistivity Ω·cm of the conductive resin 1 is the 0th power of 10, which is shown by ●, the resistance value is stable at low level in all the measurements, whereas in the case where the resistivity Ω·cm of the conductive resin 1 is the 4th power of 10, which is shown by ■, the resistance value abruptly increases upon execution of the dipping test for heating. Also, in the case where the resistivity Ω·cm of the conductive resin 1 is the 2nd power of 10, which is shown by x, there is shown a tendency that the resistance value considerably decreases upon execution of the dipping test. In addition, in the case where the resistivity Ω·cm of the conductive resin 1 is the 3rd power of 10, which is not shown, there was shown a tendency generally similar to that of the case where the resistivity Ω·cm is the 4th power of 10, which is shown by ■.

From these results, it can be understood that the resistivity Ω·cm of the conductive resin 1 needs to be set to not more than the 2nd power of 10, i.e., not more than 100 Ω·cm in order to fulfill a stable grounding of the conductive resin 1. In this first embodiment, since the resistivity of the conductive resin 1 is set to not more than 100 Ω·cm, the conductive resin 1 can be grounded stably.

Figure 7A:
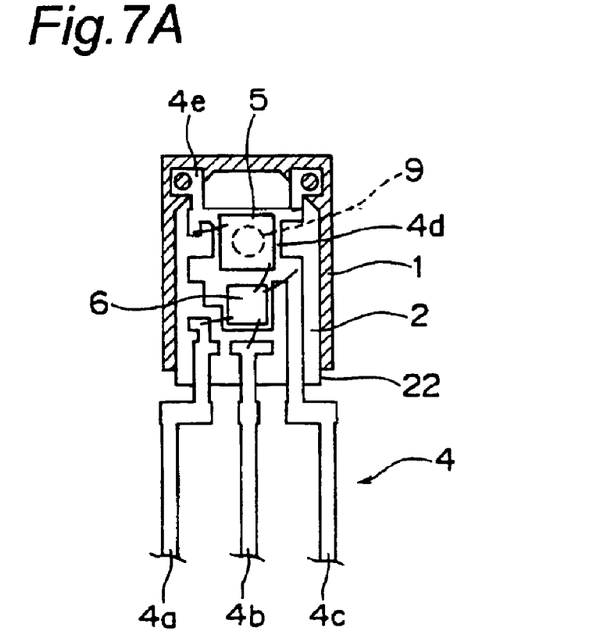
FIGS. 7A and 7B are a horizontal sectional view and a vertical sectional view for explaining the manufacturing method of the photodetection sensors.
Figure 7B:
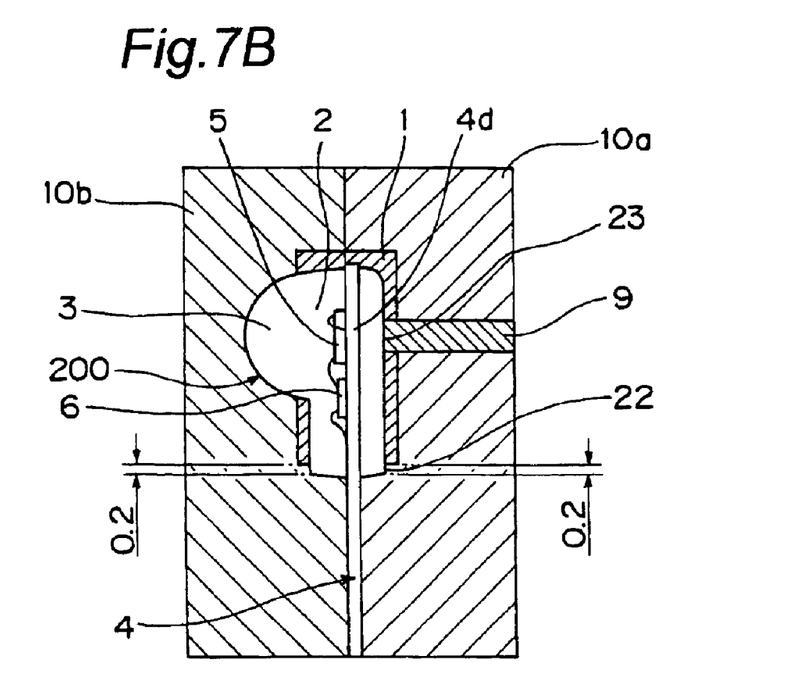

Next, with reference to FIGS. 7A and 7B, the method of manufacturing the photodetection sensor of the first embodiment, as well as the rear-side construction and the like of the photodetection sensor, are explained in detail.

First, as shown in FIGS. 7A and 7B, the photodetection chip 5 and the control-use IC chip 6 are mounted on the surface of the header 4d of the lead frame 4, and then the photodetection chip 5, the control-use IC chip 6 and part of the lead frame 4 are encapsulated in the insulative light-pervious resin 2 having the lens portion 3 confronting the frontage of the photodetection chip 5 by using an unshown metal mold. Thus, a light-pervious resin package 200 is formed.

Next, this light-pervious resin package 200 is set in a cavity within metal molds 10a, 10b for use with an electrically conductive resin, and a terminal-side exposed portion 22 of the light-pervious resin 2 of the light-pervious resin package 200 and part of the lead frame 4 are clamped by the metal molds 10a, 10b. This terminal-side exposed portion 22, which is located near the tip end portion of the generally parallel signal input/output terminals 4a, 4b and grounding terminal 4c of the lead frame 4, and which has a smooth, planar surface, makes contact with the clamping surfaces of the metal molds 10a, 10b. Accordingly, even when the conductive resin 1 is filled into the cavity within the metal molds 10a, 10b in the subsequent step, the conductive resin 1 does not cover the terminal-side exposed portion 22, so that this terminal-side exposed portion 22 is present in the completed photodetection sensor as shown in FIG. 2A. This terminal-side exposed portion 22 of the light-pervious resin 2 is so designed as to have a length of at least 0.2 mm in a direction along which the signal input/output terminals 4a, 4b extend, as shown in FIG. 7B. Therefore, by clamping the terminal-side exposed portion 22 having the length of 0.2 mm or more by the metal molds 10a, 10b, the conductive resin 1 can reliably be prevented from leaking out to vicinities of the signal input/output terminals 4a, 4b during the molding process. Thus, short-circuits between the conductive resin 1 and the signal input/output terminals 4a, 4b can reliably be prevented. If the terminal-side exposed portion 22 has a length of less than 0.2 mm in the direction along which the signal input/output terminals 4a, 4b extend, then the short-circuits between the conductive resin 1 and the signal input/output terminals 4a, 4b cannot be prevented reliably since the setting error of the light-pervious resin package 200 against the metal molds 10a, 10b is about ±0.05 mm maximum.

On the other hand, the metal mold 10a is provided with a fixed pin 9, which is free to move back and forth, as shown in FIG. 7B. The light-pervious resin package 200 is pressed against the inner surface of the metal mold 10b by this fixed pin 9, making the lens portion 3 in close contact with the inner surface of the metal mold 10b, so that the light-pervious resin package 200 is set with high precision within the metal molds 10a, 10b. Thus, the later-formed conductive resin 1 is prevented from leaking out to the surface of the lens portion 3, and moreover the thickness of the conductive resin 1 can be controlled so as to be generally uniform and precise.

Figure 8:
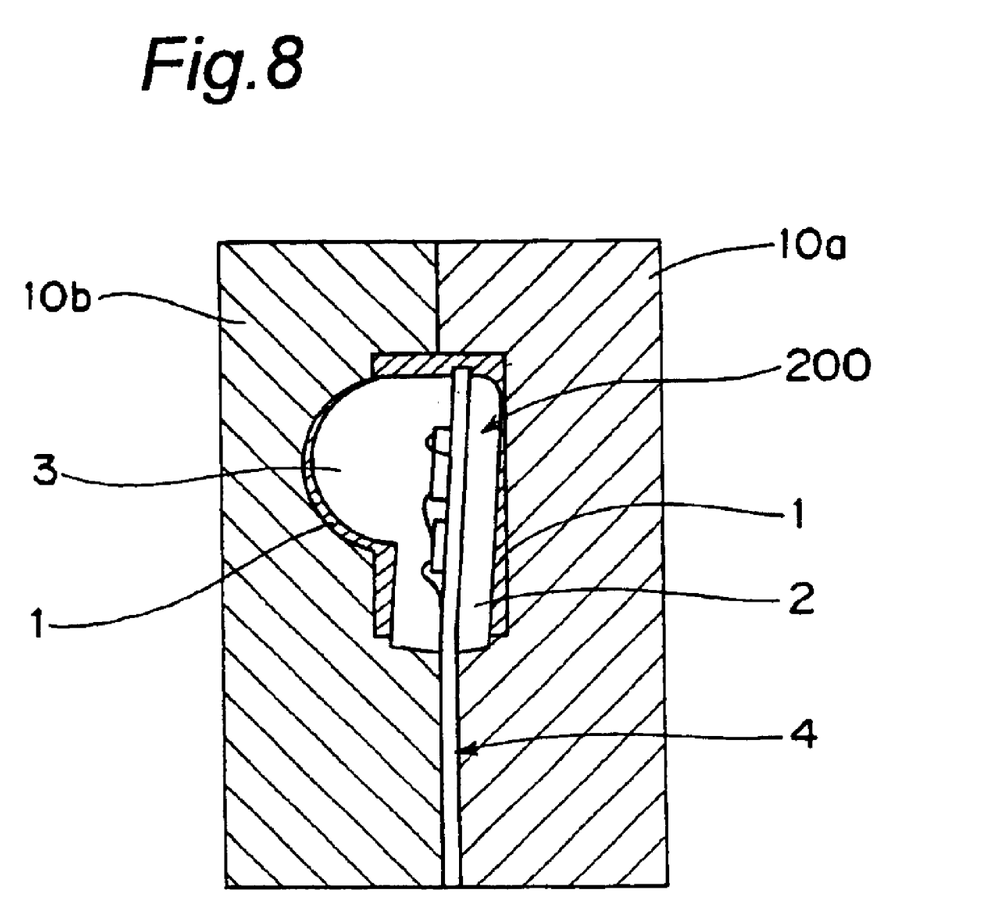
FIG. 8 is a sectional view showing the method of manufacturing the photodetection sensor of the comparative example.

Without the fixed pin 9, the light-pervious resin package 200 would be shifted in position due to the pressure of the conductive resin 1 or the like during the molding of the conductive resin 1, as in the comparative example shown in FIG. 8. In this case, there would arise problems that the thickness of the conductive resin 1 would become nonuniform, and that the surface of the lens portion 3 would be covered with the conductive resin 1.

Further, as shown in FIGS. 7A and 7B, the tip end of the fixed pin 9, which presses the light-pervious resin 2 of the light-pervious resin package 200, confronts the rear side of the header 4d of the lead frame 4 and moreover corresponds to the inner side of the profile of the rear face of the header 4d. That is, a projection plan of the tip end face of the fixed pin 9 onto the rear face of the header 4d falls inside the area of the header 4d (inside the profile of the header 4d) as shown in FIG. 7A.

In this state, as the conductive resin 1 is filled into the metal molds 10a, 10b as shown in FIGS. 7A and 7B, the conductive resin 1 never leaks out onto the surface of the lens portion 3 and therefore never covers the lens portion 3 because the lens portion 3 is in close contact with the inner surface of the metal mold 10b. Also, since the tip end of the fixed pin 9 is in close contact with the light-pervious resin 2 of the light-pervious resin package 200, the spot of the light-pervious resin 2 at which the tip end of the fixed pin 9 is in close contact therewith is never covered with the conductive resin 1, so that a rear-face-side exposed portion 23 of the light-pervious resin 2 is formed. This rear-face-side exposed portion 23 is opposed to the rear face of the lead frame 4 because the tip end face of the fixed pin 9 corresponds to the inside area of the header 4d. That is, a projection plan of the rear-face-side exposed portion 23 onto the rear face of the header 4d falls inside the profile of the rear face of the header 4d.

As shown above, there is a rear-face-side exposed portion 23 of the light-pervious resin 2 that is not covered with the conductive resin 1, and this rear-face-side exposed portion 23 of the light-pervious resin 2 is opposed to the inside of the profile of the rear face of the header 4d, and moreover the header 4d with the photodetection chip 5 and the like mounted on its surface is electrically connected to the grounding terminal 4c. Therefore, against electromagnetic noise from this rear-face-side exposed portion 23, the header 4d itself has an electromagnetic shield effect.

Consequently, according to the manufacturing method of the photodetection sensor of this first embodiment, a photodetection sensor which is capable of implementing a reliable electromagnetic shield against electromagnetic noise, and which can be used stably even under electromagnetic noise-prone environments, and in which the thickness of the conductive resin 1 is generally uniform and precise, and in which the surface of the lens portion 3 is never covered with the conductive resin 1, can be manufactured with simplicity and low price.

Figure 9:
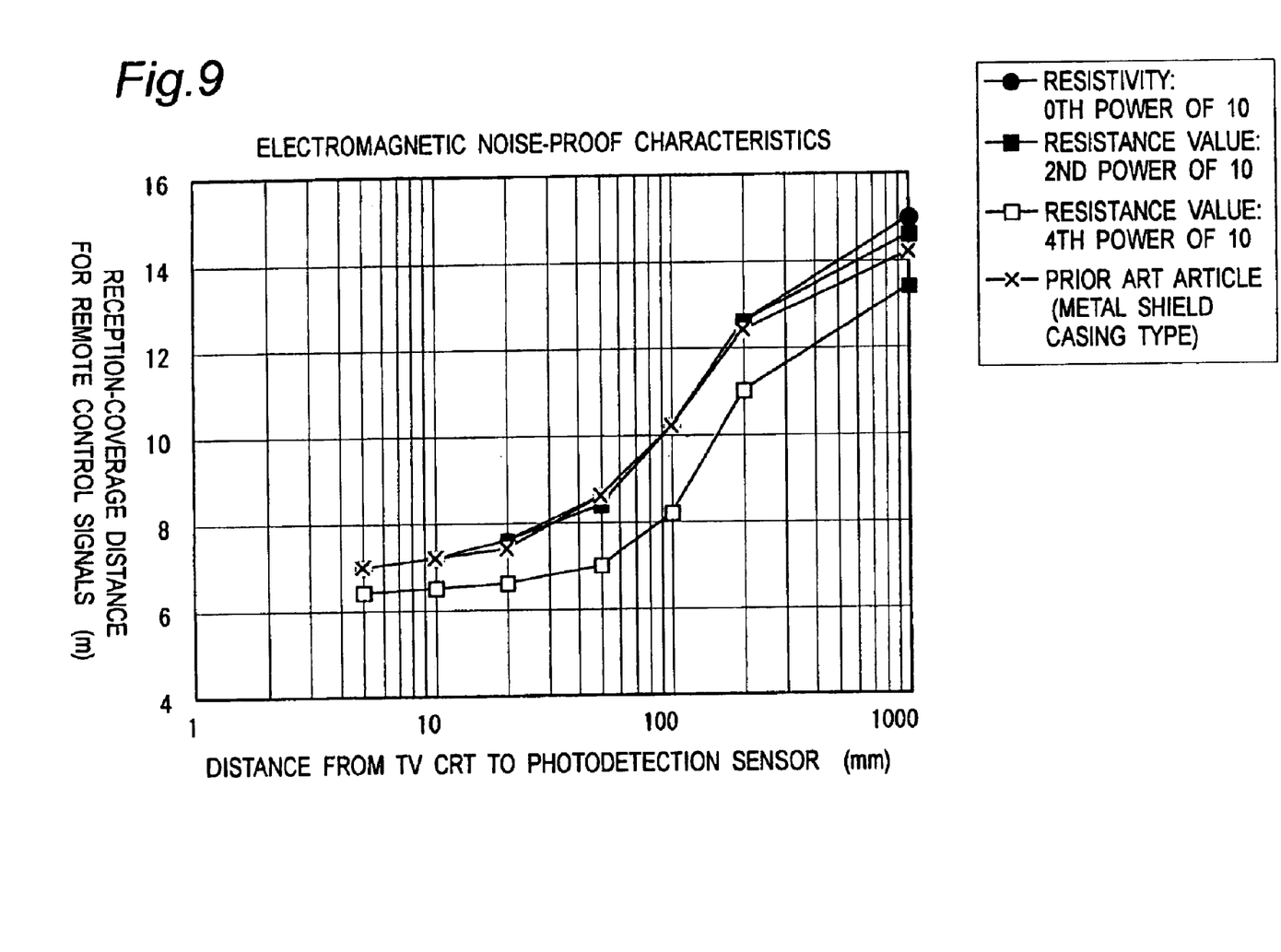
FIG. 9 is a graph showing electromagnetic noise-proof characteristics of photodetection sensors.

FIG. 9 is a graph showing electromagnetic noise-proof characteristics of the photodetection sensors of the first embodiment and the comparative example, and a conventional photodetection sensor using a metal shield casing. In FIG. 9, the vertical axis represents the reception-coverage distance (m) of remote control signals, while the horizontal axis represents the distance (mm) from the cathode-ray tube of a TV (television receiver) to the photodetection sensor. Also, in FIG. 9, ● shows a case where the resistivity of the conductive resin 1 of the first embodiment is the 0th power of 10, i.e., a value of Ω·cm of one order, ■ shows a case where the resistivity of the conductive resin 1 of the first embodiment is the 2nd power of 10 (100 Ω·cm), □ shows a case where the resistivity Ω·cm of the conductive resin of the comparative example is the 4th power of 10 (10,000 Ω·cm), and x shows a case where a conventional photodetection sensor using a metal shield casing is used.

As can be seen from this FIG. 9, in the cases where the resistivity of the conductive resin 1 is the 0th power of 10 and the 2nd power of 10, the photodetection sensor has electromagnetic noise-proof characteristics comparable to those of the conventional photodetection sensor using a metal shield casing, whereas in the case where the resistivity is the 4th power of 10, the photodetection sensor is shorter in reception-coverage distance, thus a little inferior in electromagnetic noise-proof characteristics to the conventional metal shield casing type. In addition, in the case where the resistivity of the conductive resin 1 is the 3rd power of 10, which is not shown, there was shown a tendency generally similar to that of the case where the resistivity is the 4th power of 10, which is shown by □.

From these results, it can be understood that the resistivity Ω·cm of the conductive resin 1 needs to be set to not more than the 2nd power of 10, i.e., not more than 100 Ω·cm in order to obtain electromagnetic noise-proof characteristics comparable to those of the conventional photodetection sensor using the metal shield casing. In this first embodiment, since the resistivity of the conductive resin 1 is set to not more than 100 Ω·cm, the photodetection sensor can exhibit electromagnetic noise-proof characteristics comparable to those of the conventional photodetection sensor using the metal shield casing.

Although the electrical connecting portion 4e is provided on one side of the header 4d opposite to the side on which the grounding terminal 4c is provided in the first embodiment, yet the electrical connecting portion may be provided anywhere only if electrically connected to the grounding terminal directly or indirectly. For example, in the case where the signal input/output terminals and the grounding terminal are not parallel and are largely distant from each other, which is not shown, it is possible that an electrical connecting portion having a through hole is provided so as to directly adjoin the base portion of the grounding terminal, where the electrical connecting portion is encapsulated in an electrically conductive resin.

Further, although a round hole is used as the through hole in the first embodiment, the through hole may be shaped into any form such as elliptical or polygonal or other holes. Furthermore, it is assumed that the through hole herein includes so-called one-sided holes, such as cutouts, ruggedness (including wavy forms and triangular wave form), provided in a peripheral portion of the electrical connecting portion so as to extend through the lead frame in its plate thickness direction. In the case of this one-sided hole, the size of the hole is assumed to be given by the diameter of an inscribed circle of its wall surfaces.

The Second Embodiment

Figure 10A:
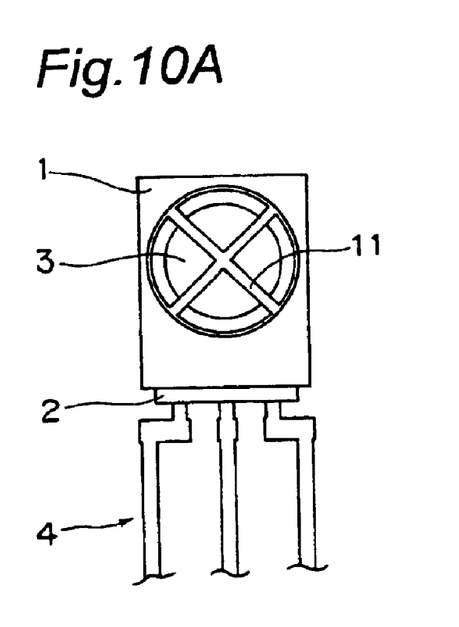
FIGS. 10A and 10B are a plan view and a side view of a photodetection sensor according to a second embodiment.
Figure 10B:
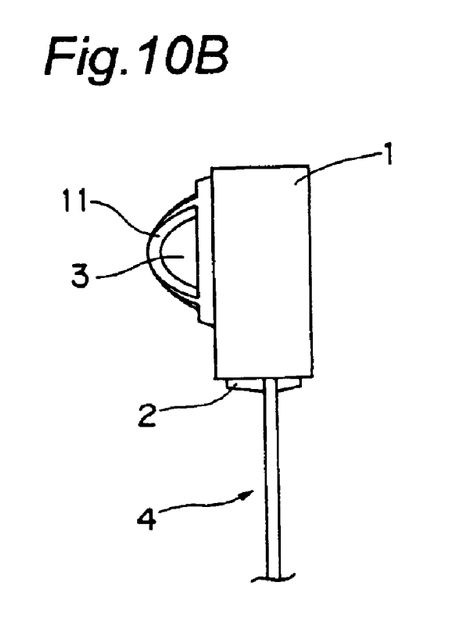

FIG. 10A is a plan view of a photodetection sensor according to a second embodiment of the present invention, and FIG. 10B is a side view of the photodetection sensor.

In FIGS. 10A and 10B, the same constituent parts as in the photodetection sensor of the first embodiment shown in FIGS. 1 and 2 are designated by like reference numerals, and their description is omitted.

As shown in FIGS. 10A and 10B, part of the surface of the lens portion 3 is covered with a meshed electrically conductive resin 11. This conductive resin 11 is coupled to the foregoing conductive resin 1, and these conductive resins 1, 11 can be integrally molded by injection molding.

It is noted that the mesh configuration of the conductive resin 11 is not limited to the one shown in FIGS. 10A and 10B, and may be a mesh configuration given by, for example, a combination of a plurality of concentric circles and a plurality of radial lines.

In this constitution, since part of the surface of the lens portion 3 is covered with the meshed conductive resin 11, it becomes possible to prevent any intrusion of electromagnetic noise from the lens portion 3, and yet to detect infrared remote-control signal light. Therefore, considerable deteriorations of reception distance characteristics can be prevented even under environments in which large electromagnetic noise is generated.

Further, since the photodetection sensor of this second embodiment does not use any separate component parts like a metal mesh, there is no need for the assembly step for separate component parts. Moreover, since the meshed conductive resin 11 can be integrally molded by injection molding, the photodetection sensor can be manufactured with simplicity and low price and at high productivity.

As apparent from the foregoing description, according to the photodetection sensor of the invention, since the electrical connecting portion directly or indirectly connected to the grounding terminal of the lead frame and having the through hole is encapsulated in the electrically conductive resin, the conductive resin runs into the through hole so that the conductive resin becomes less liable to peel off from the electrical connecting portion. Therefore, the grounding of the conductive resin can be fulfilled reliably at all times, so that the electromagnetic shielding can be fulfilled reliably at all times. Consequently, this photodetection sensor can be used stably even under electromagnetic noise-prone environments.

In the photodetection sensor of the invention, the terminal-side exposed portion of the light-pervious resin has a length of at least 0.2 mm in a direction along which the signal input/output terminals extend, short-circuits between the conductive resin and the signal input/output terminals can reliably be prevented.

In the photodetection sensor of the invention, since the resistivity of the conductive resin is not more than 100 Ω·cm, the conductive resin and the electrical connecting portion, and therefore the conductive resin and the grounding terminal are electrically connected to each other stably even against thermal stress due to soldering mounting and the like. Accordingly, this photodetection sensor, which is given a stable electromagnetic shield, can be used even under electromagnetic noise-prone environments.

In the photodetection sensor of the invention, a rear-face-side exposed portion which is not covered with the conductive resin but exposed is present at a portion of the light-pervious resin that covers the rear face of the header on one side opposite to the surface side on which the photodetection chip is mounted, and the rear-face-side exposed portion confronts the rear face of the header and a projection plan of the rear-face-side exposed portion onto the rear face of the header falls inside the profile of the rear face of the header. Therefore, the photodetection chip or the like mounted on the surface of the header is electromagnetically shielded against electromagnetic noise coming from the rear face side by the header itself adjoining and electrically connected to the grounding terminal. Consequently, this photodetection sensor can be used even under electromagnetic noise-prone environments.

Further, a necessary spot of the lens can be put into close contact with the inner surface of the metal mold by pressing the rear-face-side exposed portion of the light-pervious resin by means of a fixed pin during the molding of the conductive resin. Therefore, a light-pervious resin package can be set into the metal mold with high precision so that the conductive resin can be made generally uniform in thickness as desired with precision, and moreover the conductive resin can be prevented from leaking onto the surface of the lens portion.

In the method for manufacturing a photodetection sensor of the invention, when the light-pervious resin package is set into the metal mold for use with electrically conductive resin for encapsulating in an electrically conductive resin, the surface of the light-pervious resin of the light-pervious resin package confronting the rear face of the header and corresponding to the inside of the profile of the rear face of the header is pressed in one direction by the fixed pin, so that at least part of the lens portion is put into close contact with the inner surface of the metal mold. Therefore, the light-pervious resin package can be set into the metal mold with high precision so that the conductive resin can be made generally uniform in thickness as desired with high precision, and moreover the conductive resin can be prevented from leaking onto the surface of the lens portion. Furthermore, the spot of the light-pervious resin package to be pressed by the fixed pin, which confronts the rear face of the header and which corresponds to the inside of the profile of the rear face of the header, is not covered with the conductive resin. However, since the spot confronts the rear face of the header and corresponds to the inside of the profile of the rear face of the header, the header itself can implement the electromagnetic shielding for the photodetection chip and the like. Therefore, according to the photodetection sensor manufacturing method of the invention, the light-pervious resin package can be set into the metal mold with high precision so that the conductive resin can be made generally uniform in thickness as desired with high precision, and moreover the conductive resin can be prevented from leaking onto the surface of the lens portion. Further, a photodetection sensor, which can fulfill effective electromagnetic shielding against electromagnetic noise and be used even under electromagnetic noise-prone environments, can be manufactured with simplicity and low price.

In the photodetection sensor of the invention, since part of the surface of the lens portion is covered with the meshed electrically conductive resin, intrusion of electromagnetic noise from the lens portion can be prevented. Yet, infrared remote-control signal light can be detected. Therefore, considerable deteriorations of reception distance characteristics can be prevented even under environments in which large electromagnetic noise is generated.

Further, since this photodetection sensor does not use any separate component parts like a metal mesh, there is no need for the assembly step for separate component parts. Moreover, since the meshed conductive resin can be integrally molded by injection molding, the photodetection sensor can be manufactured with simplicity and low price and at high productivity.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A photodetection sensor comprising:
   a lead frame having a grounding terminal, a header connected to this grounding terminal, and signal input/output terminals;
   a photodetection chip mounted on a surface of the header of the lead frame;
   an insulative light-pervious resin encapsulating the photodetection chip and part of the lead frame, tip end portions of the signal input/output terminals of the lead frame being protruded from the light-pervious resin; and
   an electrically conductive resin encapsulating a surface of the light-pervious resin except at least a terminal-side exposed portion of the light-pervious resin in vicinity of the tip end portions of the signal input/output terminals, and wherein
   the lead frame includes:
   an electrical connecting portion directly or indirectly connected to the grounding terminal of the lead frame and having a through hole, and wherein
   the electrical connecting portion is protruded from the light-pervious resin and encapsulated in the electrically conductive resin.

2. The photodetection sensor according to claim 1, wherein a diameter of the through hole is not less than a plate thickness of the lead frame.

3. The photodetection sensor according to claim 1, wherein
   the terminal-side exposed portion of the light-pervious resin has a length of at least 0.2 mm in a direction along which the signal input/output terminals extend.

4. The photodetection sensor according to claim 1, wherein
   the electrically conductive resin has a resistivity of not more than 100 Ω·cm.

5. The photodetection sensor according to claim 1, wherein
   the light-pervious resin has a lens portion confronting the photodetection chip, and wherein
   a rear-face-side exposed portion that is not covered with the electrically conductive resin but exposed is present at a portion of the light-pervious resin that covers a rear face of the header on one side opposite to a surface side on which the photodetection chip is mounted, and this rear-face-side exposed portion confronts the rear face of the header and a projection plan of the rear-face-side exposed portion onto the rear face of the header falls inside a profile of the rear face of the header.

6. The photodetection sensor according to claim 1, wherein
   the light-pervious resin has a lens portion confronting the photodetection chip, and
   the photodetection sensor further includes a meshed electrically conductive resin that covers part of a surface of the lens portion.

7. A photodetection sensor comprising:
   a lead frame having a grounding terminal, a header connected to this grounding terminal, and signal input/output terminals;
   a photodetection chip mounted on a surface of the header of the lead frame;
   an insulative light-pervious resin encapsulating the photodetection chip and part of the lead frame, tip end portions of the signal input/output terminals of the lead frame being protruded from the light-pervious resin; and an electrically conductive resin encapsulating a surface of the light-pervious resin except at least a terminal-side exposed portion of the light-pervious resin in vicinity of the tip end portions of the signal input/output terminals, and wherein the terminal-side exposed portion of the light-pervious resin has a length of at least 0.2 mm in a direction along which the signal input/output terminals extend.

8. A photodetection sensor comprising:

a lead frame having a grounding terminal, a header connected to this grounding terminal, and signal input/output terminals;

a photodetection chip mounted on a surface of the header of the lead frame;

an insulative light-pervious resin encapsulating the photodetection chip and part of the lead frame, tip end portions of the signal input/output terminals of the lead frame being protruded from the light-pervious resin; and an electrically conductive resin encapsulating a surface of the light-pervious resin except at least a terminal-side exposed portion of the light-pervious resin in vicinity of the tip end portions of the signal input/output terminals, and wherein the lead frame includes:

an electrical connecting portion directly or indirectly connected to the grounding terminal, the electrical connecting portion is protruded from the light-pervious resin and encapsulated in the electrically conductive resin, and wherein the electrically conductive resin has a resistivity of not more than 100 Ω·cm.

9. A photodetection sensor comprising:

a lead frame having a grounding terminal, a header connected to this grounding terminal, and signal input/output terminals;

a photodetection chip mounted on a surface of the header of the lead frame;

an insulative light-pervious resin encapsulating the photodetection chip and part of the lead frame, tip end portions of the signal input/output terminals of the lead frame being protruded from the light-pervious resin; and an electrically conductive resin encapsulating a surface of the light-pervious resin except at least a terminal-side exposed portion of the light-pervious resin in vicinity of the tip end portions of the signal input/output terminals, and wherein the light-pervious resin has a lens portion confronting the photodetection chip, and wherein a rear-face-side exposed portion that is not covered with the electrically conductive resin but exposed is present at a portion of the light-pervious resin that covers a rear face of the header on one side opposite to a surface side on which the photodetection chip is mounted, and this rear-face-side exposed portion confronts the rear face of the header and a projection plan of the rear-face-side exposed portion onto the rear face of the header falls inside a profile of the rear face of the header.

10. A method for manufacturing a photodetection sensor, comprising the steps of:

mounting a photodetection chip onto a surface of a header of a lead frame connected to a grounding terminal of the lead frame, and encapsulating the photodetection chip and part of the lead frame in an insulative light-pervious resin having a lens portion confronting the photodetection chip, by which a light-pervious resin package is formed; and setting the light-pervious resin package into a metal mold for use with electrically conductive resin, and pressing in one direction, by means of a fixed pin, a surface of the light-pervious resin of the light-pervious resin package confronting a rear face of the header and corresponding to inside of a profile of the rear face of the header, by which at least part of the lens portion is put into close contact with an inner surface of the metal mold, and injecting an electrically conductive resin into the metal mold, by which the light-pervious resin package except at least part of the lens portion is encapsulated in the electrically conductive resin.

11. A photodetection sensor comprising:

a lead frame having a grounding terminal, a header connected to this grounding terminal, and signal input/output terminals;

a photodetection chip mounted on a surface of the header of the lead frame;

an insulative light-pervious resin encapsulating the photodetection chip and part of the lead frame, tip end portions of the signal input/output terminals of the lead frame being protruded from the light-pervious resin; and an electrically conductive resin encapsulating a surface of the light-pervious resin except at least a terminal-side exposed portion of the light-pervious resin in vicinity of the tip end portions of the signal input/output terminals, and wherein the light-pervious resin has a lens portion confronting the photodetection chip, and wherein the photodetection sensor further includes a meshed electrically conductive resin that covers part of a surface of the lens portion.

* * * * *